United States Patent
Gard et al.

(10) Patent No.: US 9,692,473 B2
(45) Date of Patent: Jun. 27, 2017

(54) OFFSET COMPENSATION IN A RECEIVER

(71) Applicant: Analog Devices, Inc., Norwood, MA (US)

(72) Inventors: Kevin Glenn Gard, Raleigh, NC (US); Robert C. Glenn, Cary, NC (US)

(73) Assignee: ANALOG DEVICES, INC., Norwood, MA (US)

(*) Notice: Subject to any disclaimer, the term of this patent is extended or adjusted under 35 U.S.C. 154(b) by 0 days.

(21) Appl. No.: 14/709,207

(22) Filed: May 11, 2015

(65) Prior Publication Data

US 2015/0333786 A1 Nov. 19, 2015

Related U.S. Application Data

(60) Provisional application No. 61/994,702, filed on May 16, 2014.

(51) Int. Cl.
*H04B 1/10* (2006.01)
*H04B 1/30* (2006.01)
(Continued)

(52) U.S. Cl.
CPC ............. *H04B 1/30* (2013.01); *H03F 3/19* (2013.01); *H03F 3/45071* (2013.01); *H04B 1/18* (2013.01);
(Continued)

(58) Field of Classification Search
CPC .......... H04B 1/30; H04B 1/0082; H04B 1/40; H04B 17/00; H04B 17/20; H04B 17/345;
(Continued)

(56) References Cited

U.S. PATENT DOCUMENTS 5,616,187 A * 4/1997 Nelson .................. C21D 1/18
148/333
6,690,225 B2  2/2004 Kondo et al.
(Continued)

FOREIGN PATENT DOCUMENTS

CH      211374      9/1940
CN      102113281   6/2011
(Continued)

OTHER PUBLICATIONS

Peichen, et al., "A High Linearity Downconverter for SAW-less LTE Receivers," Journal of Semiconductors, vol. 33, No. 10, Oct. 2012, pp. 105002-1 to 105002-6.
(Continued)

*Primary Examiner* — Leila Malek
(74) *Attorney, Agent, or Firm* — Knobbe, Martens, Olson & Bear, LLP

(57) ABSTRACT

Aspects of this disclosure relate to compensating for an offset in a receiver. In one embodiment, the receiver comprises a mixer, a feedback amplifier, and an offset correction circuit. The offset correction circuit can generate an indication of an offset in a differential input to the feedback amplifier and apply an offset compensation signal at an offset compensation node. The offset compensation node can be in a signal path of the feedback amplifier. Such offset compensation can reduce or eliminate leakage from a local oscillator at an input port of the mixer and/or at an antenna port of the receiver.

20 Claims, 5 Drawing Sheets

(51) Int. Cl.
*H04B 1/18* (2006.01)
*H03F 3/19* (2006.01)
*H03F 3/45* (2006.01)

(52) U.S. Cl.
CPC ............... *H03F 2200/451* (2013.01); *H03F 2203/45336* (2013.01)

(58) Field of Classification Search
CPC .. H04B 1/0475; H04B 1/12; H04B 2001/305; H03D 2200/009; H03D 7/1466
USPC ...... 375/219, 221, 346; 455/114.2, 296, 324
See application file for complete search history.

(56) References Cited

U.S. PATENT DOCUMENTS

| | | | |
|---|---|---|---|
| 6,944,436 B2 | 9/2005 | Woo et al. | |
| 7,620,332 B2 | 11/2009 | Nishiyama | |
| 7,876,155 B2 | 1/2011 | Aroca et al. | |
| 8,588,723 B2 | 11/2013 | Chen | |
| 2003/0148750 A1* | 8/2003 | Yan | H03D 3/008 455/305 |
| 2004/0157573 A1 | 8/2004 | Lee et al. | |
| 2006/0125543 A1* | 6/2006 | Hsieh | H03F 3/45973 327/307 |
| 2008/0020728 A1* | 1/2008 | Zhuo | H03D 7/1441 455/313 |
| 2009/0258626 A1 | 10/2009 | Yamada et al. | |
| 2010/0026383 A1* | 2/2010 | Ahrari | H04L 27/364 327/551 |
| 2014/0266886 A1* | 9/2014 | Wang | G01S 19/33 342/357.73 |

FOREIGN PATENT DOCUMENTS

| | | |
|---|---|---|
| KR | 10-2004-0071977 | 8/2004 |
| KR | 10-2012-0022950 | 3/2012 |
| KR | 10-1210634 | 12/2012 |

OTHER PUBLICATIONS

Zhou, et al., "A CMOS Passive Mixer With Low Flicker Noise for Low-Power Direct-Conversion Receiver," IEEE Journal of Solid-State Circuits, vol. 40, No. 5, May 2005, pp. 1084-1093.
Korean Office Action of Jan. 19, 2016 for Korean Patent Application No. 10-2015-0067936 filed May 15, 2015. 11 pages with translation.
Korean Office Action of Jul. 26, 2016 for Korean Patent Application No. 10-2015-0067936 filed May 15, 2015, 5 pages and 4 page translation.
German Office Action dated Sep. 8, 2016 for German Patent Application No. 10 2015 107 568.7 filed May 13, 2015.
Notice of Final Rejection of Jan. 26, 2017 for Korean Patent Application No. 10-2015-0067936 filed May 15, 2015, 3 pages and translation 2 pages.
Chinese Office Action of Feb. 27, 2017 for Chinese Patent Application No. 201510246803.X, 7 pages.

* cited by examiner

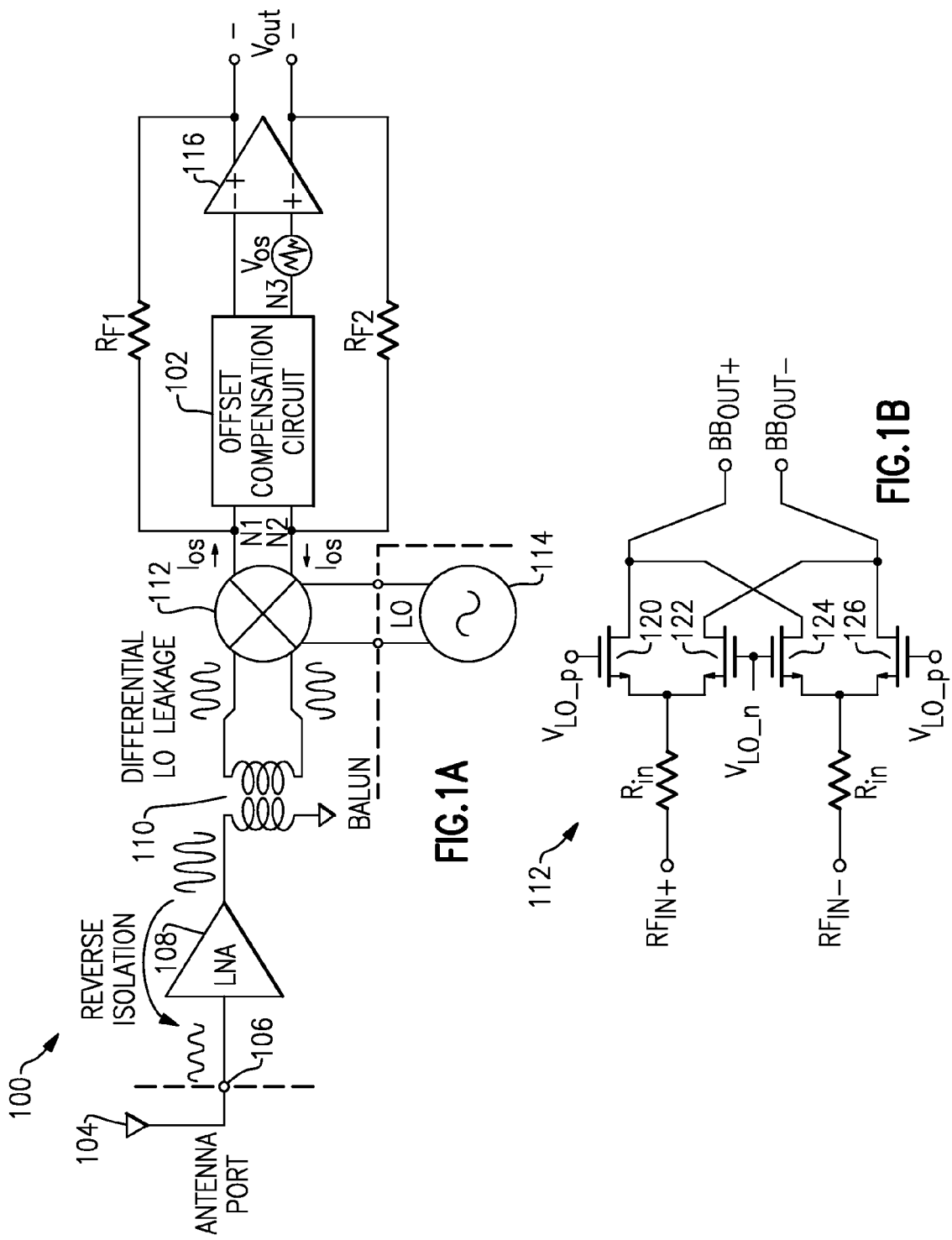

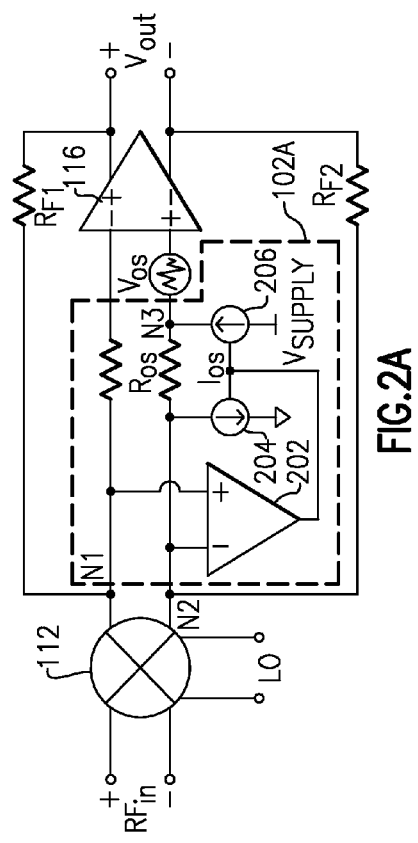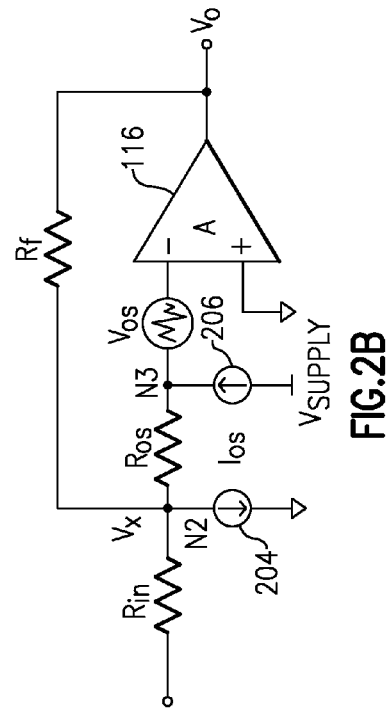

OFFSET COMPENSATION IN A RECEIVER

CROSS REFERENCE TO RELATED APPLICATION

This application is a non-provisional of and claims the benefit under 35 U.S.C. §119(e) of U.S. Provisional App. No. 61/994,702, filed May 16, 2014, titled "OFFSET COMPENSATION IN A RECEIVER," the entire disclosure of which is hereby incorporated by reference herein.

TECHNICAL FIELD

The disclosed technology relates to electronics, and, more particularly, to offset compensation in a receiver.

DESCRIPTION OF THE RELATED TECHNOLOGY

Receivers, such as direct conversion receivers, include electronic components such as low-noise amplifiers, mixers, and amplifiers. Some receivers can receive radio frequency (RF) signals using an antenna. Noise at an antenna port of a receiver can be undesirable. For example, in some applications, unwanted RF emissions at antenna ports of 3G and 4G digital cellular base stations are strictly regulated to prevent interference with base station receivers that may be operating in proximity to a base station transceiver or transmitter/receiver. In one example standard, receive band emissions for electromagnetic interference (EMI) for collocated base stations are specified to be below −96 dBm at the antenna port of the base station, which is the equivalent of 5 µV across a 50 ohm load. Electronic components of a receiver can cause noise at an antenna port of a receiver. For instance, offsets in a receiver that result from receiver components can cause noise, such as local oscillator leakage, at the antenna port of the receiver.

Accordingly, a need exists for reducing an offset within the receiver and/or for reducing noise at an antenna port of a receiver.

SUMMARY OF CERTAIN INVENTIVE ASPECTS

One aspect of this disclosure is an apparatus that includes a receiver. The receiver includes a mixer, a feedback amplifier, and an offset compensation circuit. The mixer is configured to downconvert an input signal and to generate a differential signal. The feedback amplifier includes an amplifier configured to amplify the differential signal and a feedback path between an output terminal of the feedback amplifier and an input terminal of the feedback amplifier. The feedback path includes a resistive circuit element electrically connected to a feedback node disposed between the mixer and the input terminal of the feedback amplifier. The offset compensation circuit is configured to generate an indication of an offset in the differential signal. The offset compensation circuit is also configured to apply, based at least partly on the indication of the offset in the differential signal, an offset compensation signal at an offset compensation node. The offset compensation node is in a signal path between the feedback node and the output terminal of the feedback amplifier.

Another aspect of this disclosure is an apparatus that includes a local oscillator, a mixer, a feedback amplifier, and an offset compensation circuit. The local oscillator is configured to generate a local oscillator output. The mixer is coupled to the local oscillator. The mixer is configured to downconvert a radio frequency signal based at least partly on the local oscillator output. The feedback amplifier includes an amplifier configured to receive an output from the mixer at an input terminal of the feedback amplifier. The feedback amplifier also includes a feedback element disposed between an output terminal of the feedback amplifier and the input terminal of the feedback amplifier. The feedback element is electrically connected to a feedback node disposed between the mixer and the input terminal of the feedback amplifier. The offset compensation circuit is configured to generate an indication of an offset present at the input terminal of the feedback amplifier. The offset compensation circuit is configured to apply, based at least partly on the indication of the offset, an offset compensation signal at an offset compensation node that is in a signal path between the feedback node and the output terminal of the feedback amplifier. The offset compensation signal is configured to cause leakage current from the local oscillator at an input port of the mixer to be reduced.

Another aspect of this disclosure is an electronically implemented method of compensating for an offset in a receiver. The method includes providing, by a passive mixer of a receiver, a differential signal to input terminals of a transimpedance amplifier. The transimpedance amplifier includes an amplifier and a feedback path between one of the input terminals and an output terminal of the transimpedance amplifier. The feedback path includes a resistive circuit element electrically coupled to a feedback node disposed between the passive mixer and the one of the input terminals. The method includes detecting an offset in the differential signal received by the transimpedance amplifier. The method also includes applying the offset compensation signal at an offset correction node to compensate for the detected offset, in which the offset correction node is in a signal path between the feedback node and the output of the transimpedance amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments of the invention and are not intended to be limiting.

FIG. 1A is a schematic diagram of direct conversion receiver with an offset compensation circuit configured to reduce local oscillator leakage, according to an embodiment.

FIG. 1B is a schematic diagram of an illustrative passive mixer of the direct conversion receiver of FIG. 1A.

FIG. 2A is a schematic diagram of a portion of a receiver including an offset compensation circuit configured to detect an offset at an amplifier summing node and to compensate for the offset at an input of the amplifier, according to an embodiment.

FIG. 2B is a schematic diagram of a portion of a direct conversion receiver supporting analysis of offset correction at an input terminal of the amplifier of FIG. 2A.

DETAILED DESCRIPTION OF CERTAIN EMBODIMENTS

Figure 3:
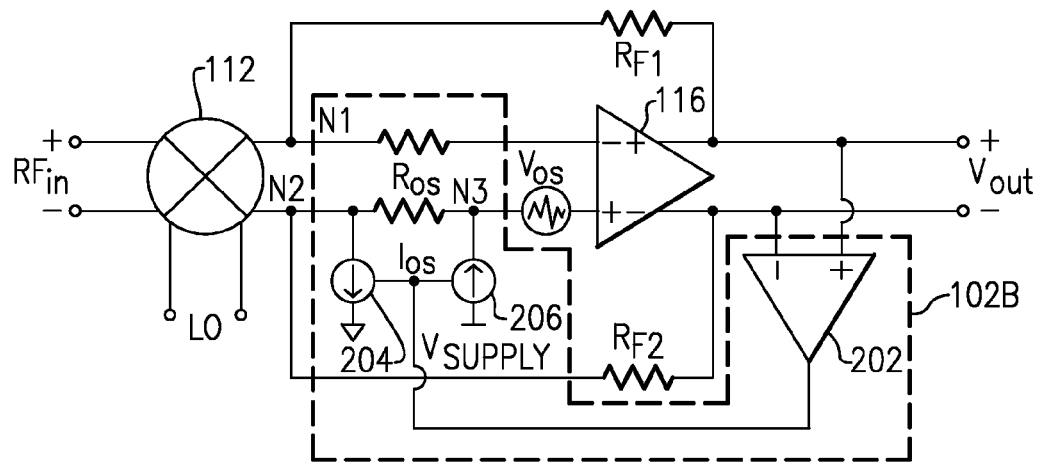
FIG. 3 is a schematic diagram of a portion of a receiver including an offset compensation circuit configured to detect an offset at an output of an amplifier and to compensate for the offset at an input of the amplifier, according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale.

As discussed above, noise at an antenna port of a receiver can be undesirable. As one example, in certain applications, unwanted RF emissions at the antenna port of 3G and 4G digital cellular base stations are strictly regulated to prevent interference with base station receivers that may be operating in proximity to a base station transceiver.

Implementing wideband receivers that comply with standards, such as 3G and/or 4G, is typically desirable. There is an increasing desire to cover more communications standards and/or to operate over more frequency bands. There is also a desire to implement receiver architectures in a power efficient and economical way. Direct conversion receivers have been used to meet such objectives.

In a direct conversion receiver, an analog signal is converted to a baseband signal and then the baseband signal is digitized. One problem associated with direct conversion receivers is local oscillator leakage. A local oscillator for a direct conversion receiver can operate at a frequency within the receive band of a base station. Signals generated by the local oscillator may leak to the antenna port or to another receiver input port through the finite isolation of receiver front-end circuits, such as a low-noise amplifier (LNA). A local oscillator output signal can be applied to a mixer to translate a received signal, which can be an RF signal, to baseband. The local oscillator output signal can be isolated from the RF inputs by the balance of the mixer devices, for example. However, when mismatches are present in the mixer and/or at the mixer interface, the balance can be upset. Accordingly, the local oscillator output signal may leak to an input port of mixer and, in some instances, to an input port of the receiver, such as an antenna port. The leakage at the input port of the receiver can be proportional to an offset resulting from the mismatch. Leakage from the local oscillator at the antenna port is undesirable and can cause offsets, inaccuracies, failures, or any combination thereof in an electronic system.

There are strict limits on leakage at antenna ports defined by certain standards. For example, receive band emissions for collocated base stations are specified to be below −96 dBm at the antenna port of the base station in one standard. The offset correction disclosed herein can be implemented in receivers to meet leakage specifications.

Aspects of this disclosure relate to compensating for an offset in a receiver, such as a direct conversion receiver. In one embodiment, the receiver comprises a passive mixer, a feedback amplifier such as a transimpedance amplifier, and an offset correction circuit. The offset correction can generate an indication of an offset in a differential input to the transimpedance amplifier and apply an offset compensation signal at an offset compensation node. The offset compensation node can be in the amplifier signal path and within a feedback loop of the transimpedance amplifier. Such offset compensation can reduce or eliminate leakage from a local oscillator at an input port of the passive mixer and/or at an antenna port of the receiver.

FIG. 1A is a schematic diagram of direct conversion receiver 100 with an offset compensation circuit 102 configured to reduce local oscillator leakage, according to an embodiment. The direction conversion receiver 100 illustrated in FIG. 1A includes an offset compensation circuit 102, an antenna 104, an antenna port 106, a low-noise amplifier (LNA) 108, a balun 110, a mixer 112, a local oscillator 114, and an amplifier 116. It will be understood that the direct conversion receiver 100 can include more or fewer elements than illustrated in FIG. 1A. In certain embodiments, the offset compensation circuit 102, the antenna port 106, the LNA 108, the balun 110, the mixer 112, and the amplifier 116 can be included on an integrated circuit and the antenna 104 and the local oscillator 114 can be external or internal to the integrated circuit.

The illustrated receiver 100 can receive an RF signal at the antenna 104. The RF signal can be provided to the antenna port 106. Antenna ports, such as the antenna port 106, may not have a one to one correspondence with physical antennas, such as the antenna 104. Rather, antenna ports can be logical entities defined by their reference signal sequences. Multiple antenna port signals can be transmitted on a single transmit antenna. In some other applications, a single antenna port can be spread across multiple transmit antennas.

The RF signal received at the antenna port 106 can be provided to the LNA 108. As illustrated, the LNA 108 amplifies the RF signal and provides the amplified RF signal to the balun 110. The balun 110 provides a differential balun output signal to the mixer 112. The balun 110 can be a transformer balun, for example. The local oscillator 114 can apply a local oscillator output signal to the mixer 112.

The mixer 112 can be a passive mixer. With low-pass or band-pass filtering implemented post mixing, the mixer 112 can downconvert the differential balun output from RF to baseband. The mixer 112 can provide a differential baseband signal to the amplifier 116. As an example, the mixer 112 can be a Gilbert cell mixer. In one implementation, the mixer 112 can be a Gilbert cell quad multiplier block. The mixer 112 can be implemented by field effect transistors (FETs), such as metal oxide semiconductor (MOS) transistors, which can be in complementary form, junction field effect transistors (JFETs), laterally diffused metal oxide semiconductor (LD-MOS) transistors, GaAs metal semiconductor field effect or pseudomorphic high mobility (GaAs MESFET or pHEMT) transistors, bipolar transistors, or the like. While the terms "metal" and "oxide" may be present in, for example, MOS, such transistors can have gates made out of materials other than metals, such as polysilicon, and have dielectric oxide regions made from dielectrics other than silicon oxide, such as a high-k dielectric.

FIG. 1B is a schematic diagram of an illustrative mixer 112 of the direct conversion receiver of FIG. 1A. The mixer 112 illustrated in FIG. 1B is a passive mixer. A passive mixer can be implemented by field effect transistors. In a passive mixer, each transistor can operate as a switch that is either on or off. The transistors of a passive mixer can electrically connect two nodes when on and electrically isolate two nodes when off. In a passive mixer, transistors can be periodically turned on and off to mix signals. A passive mixer can be in series with an active circuit and pass DC current of the active circuit.

The mixer 112 of FIG. 1B can be implemented by field effect transistors, such as NMOS transistors and/or PMOS transistors. Differential local oscillator output signals $V_{LO\_P}$ and $V_{LO\_N}$ can turn different transistors of the mixer 112 on and off. The mixer 112 can alternatingly connect positive and negative RF inputs $RF_{IN+}$ and $RF_{IN-}$ to positive and negative baseband outputs $BB_{OUT+}$ and $BB_{OUT-}$ of the mixer 112 based on an output from the local oscillator 114 of FIG. 1A.

In a first state, a positive local oscillator output signal $V_{LO\_P}$ can turn on transistors 120 and 126 and a negative local oscillator output signal $V_{LO\_N}$ can turn off transistors 122 and 124. Accordingly, in the first state, a positive baseband output $BB_{OUT+}$ can receive a positive RF input $RF_{IN+}$ and a negative baseband output $BB_{OUT-}$ can receive a negative RF input $RF_{IN-}$. In response to the states of output of the local oscillator output signals $V_{LO\_P}$ and $V_{LO\_N}$ changing, the mixer 112 can transition from operating in the first state to operating in a second state. In the second state, the positive local oscillator output signal $V_{LO\_P}$ can turn off transistors 120 and 126 and the negative local oscillator output signal $V_{LO\_N}$ can turn on transistors 122 and 124. Accordingly, in the second state, the positive baseband output $BB_{OUT+}$ can receive the negative RF input $RF_{IN-}$ and the negative baseband output $BB_{OUT-}$ can receive the positive RF input $RF_{IN+}$.

Referring back to FIG. 1A, the illustrated amplifier 116 is a transimpedance amplifier. A transimpedance amplifier can have a current input and a voltage output. An example transimpedance amplifier is an operational amplifier. The amplifier 116 can also be a differential amplifier. As illustrated, the amplifier 116 can receive a differential baseband input from the mixer 112 and generate a differential amplified output voltage $V_{OUT}$. The illustrated amplifier 116 provides a low impedance baseband load for the mixer 112. The amplifier 116 can perform a current to voltage conversion on the differential output from the mixer 112.

The illustrated amplifier 116 is arranged as a feedback amplifier with feedback paths including one or more resistive circuit elements coupled between an output terminal of the amplifier 116 and an input terminal of the amplifier 116. Feedback paths can be referred to as feedback loops. In FIG. 1A, a first feedback path includes a first resistor $R_{F1}$ that is coupled between a non-inverting output terminal of the amplifier 116 and an inverting input terminal of the amplifier 116. More specifically, as illustrated, the first resistor $R_{F1}$ can be coupled between the non-inverting output terminal of the amplifier 116 and a first feedback node N1. As illustrated, the first feedback node N1 corresponds to an output of the mixer 112 and to the inverting input terminal of the amplifier 116. In FIG. 1A, a second feedback path includes a second resistor $R_{F2}$ that is coupled between a inverting output terminal of the amplifier 116 and a non-inverting input terminal of the amplifier 116. More specifically, as illustrated, the second resistor $R_{F2}$ can be coupled between the inverting output terminal of the amplifier 116 and a second feedback node N2. As illustrated, the second feedback node N2 is disposed between the mixer 112 and the non-inverting input terminal of the amplifier 116 with a model for input offset voltage $V_{OS}$ between the second feedback node N2 and the non-inverting input terminal. It will be understood that the input offset voltage $V_{OS}$ is not a physical component and that the second feedback node N2 can be the same node as the non-inverting input terminal.

A gain of the amplifier 116 can be based on the resistance value of the first resistor $R_{F1}$ and/or the resistance value of the second resistor $R_{F2}$. For example, as illustrated, the resistance values of the first resistor $R_{F1}$ and the second resistor $R_{F2}$ can set the gain of the amplifier 116. The resistance values of the first resistor $R_{F1}$ and the second resistor $R_{F2}$ can be approximately equal in certain applications. However, other values can be used and will be readily determined by one of ordinary skill in the art.

FIG. 1A illustrates how leakage from the local oscillator 114 can propagate to the antenna port 106 in the absence of offset compensation by the offset compensation circuit 102. Differential imbalances within the amplifier 116, such as mismatched transistors and/or resistors within the amplifier 116, can create a voltage offset that is observable at an input of the amplifier 116. An offset at the input of the amplifier 116 is modeled by the input offset voltage $V_{OS}$ shown in FIG. 1A. Differential imbalances within the amplifier 116 can also create a voltage offset that is observable at an output of the amplifier 116.

The input offset voltage $V_{OS}$ can create an error in the high frequency switching time between switches, such as NMOS, PMOS, and/or CMOS switches, of the mixer 112 that alternatingly electrically connect the positive and negative RF inputs $RF_{IN+}$ and $RF_{IN-}$ of the mixer 112 to the non-inverting and inverting input terminals of the amplifier 116. For instance, the presence of the input offset voltage $V_{OS}$ can create an error in the high frequency switching time between the commutating mixer switches 120, 122, 124, and 126 of FIG. 1B that are configured to connect the positive RF input $RF_{IN+}$ and the negative RF input $RF_{IN-}$ to the non-inverting input and inverting input of the amplifier 116.

A resulting differential imbalance of the mixer 112 can cause leakage from the local oscillator 114 at an RF input port of the mixer 112 and a direct current (DC) differential current at the output of the mixer 112 that are proportional to the input offset voltage $V_{OS}$ of the amplifier 116. As illustrated in FIG. 1A, differential local oscillator leakage current can leak through the front end circuits of the receiver, such as the LNA 108 that has finite isolation, to the antenna port 106, absent offset compensation. The reverse isolation of the LNA 108 can be limited by internal capacitances of the LNA 108 in certain implementations. The leakage current from the local oscillator 114 can leak though the LNA 108 via capacitive coupling, for example.

As shown in FIG. 1A, the offset compensation circuit 102 can be disposed in series between a feedback node N2 and an offset compensation node N3. According to some other embodiments, a portion of the offset compensation circuit can be disposed in series between a feedback node N2 and an offset compensation node N3. The offset compensation circuit 102 can be in a feedback loop of the amplifier 116. The offset compensation circuit 102 can compensate for the DC offset voltage $V_{OS}$ that can be present at the input of the amplifier 116 without compensation. This can reduce or eliminate leakage current from the local oscillator 114 at the RF input port of the mixer 112 and/or leakage current from the local oscillator 114 at the antenna port 106, which improves EMI characteristics. The offset compensation circuit 102 can generate an indication of an offset in the differential input signal to the amplifier 116. The indication of the offset in the differential input signal to the amplifier 116 can be generated, for example, based on the differential input to the amplifier 116, the differential output of the amplifier 116, differential interstage signals of the amplifier 116, or any combination thereof. When the indication of the offset in the differential input signal is generated from the differential output of the amplifier 116, a non-linear feedback loop can be implemented. Such a non-linear feedback look can include a correction digital-to-analog converter, which can be updated at a frequency below a desired signal bandwidth and/or at startup. More details regarding generating the indication of the offset in the differential input signal to the amplifier 116 will be provided with reference to FIGS. 2A to 6. Based on the indication of the offset in the differential signal to the amplifier 116, the offset compensation circuit 102 can apply an offset compensation signal at an offset compensation node N3.

The offset compensation node N3 can be in a signal path between the mixer 112 and the inverting output of the amplifier 116. In FIG. 1A, the offset compensation node N3 is also in the feedback path between the inverting output terminal of the amplifier 116 and the non-inverting input terminal of the amplifier 116, in which the feedback path includes the feedback resistor $R_{F2}$, as also illustrated. Alternatively or additionally, the offset compensation node can be in a signal path between the mixer 112 and the non-inverting output of the amplifier 116 (not illustrated in FIG. 2A). In such instances, the offset compensation node can also be in the feedback path between the non-inverting output terminal of the amplifier 116 and the inverting input terminal of the amplifier 116.

The offset compensation node N3 can be disposed in the signal path between the feedback node N2 and an output terminal of the amplifier 116. In certain embodiments, an offset compensation node, such as the offset compensation node N3, is between a feedback node, such as the second feedback node N2, and an input to the amplifier 116.

Applying an offset correction signal, such as an offset correction current or an offset correction voltage, at an offset correction node can reduce or eliminate the input offset voltage $V_{OS}$. As such, a differential DC offset voltage at the input of the amplifier can be compensated for to prevent leakage current from the local oscillator at the RF input port of a passive mixer having an output connected the amplifier input. Additionally, in certain implementations, DC offset voltages at both the input and output of the amplifier can be compensated. The offset compensation circuit 102 can sense or measure the differential DC offset voltage at the input of the amplifier 116, the output of the amplifier 116, or at an intermediate stage of the amplifier 116. As discussed above, in certain implementations, such a feedback loop can be non-linear when the output of the amplifier 116 is sampled to generate the indication of the differential DC offset voltage at the input of the amplifier 116. The offset compensation circuit can generate an offset correction voltage within the feedback loop of the amplifier 116 and provide negative feedback control of the generated offset compensation voltage to cancel the amplifier offset. The offset voltage can be applied at an input of the amplifier 116 or at an output of a first stage of the amplifier 116 when the amplifier 116 includes more than one stage.

FIGS. 2A to 6 illustrate various embodiments of the offset compensation circuit 102 in a receiver and models of offset compensation. Any of the principles and advantages of the offset compensation in these embodiments can be applied to the receiver 100 of FIG. 1A. For example, the offset compensation circuit 102 can include any combination of features of the offset compensation circuits 102A, 102B, 102C, 102D, and/or 102E. As another example, offset correction can be applied at different nodes of the receiver 100 of FIG. 1A in accordance with the principles and advantages of the embodiments of FIGS. 2A to 6. Moreover, any combination of features of the offset compensation of FIGS. 2A to 6 can be combined, as appropriate. According to certain embodiments, the offset compensation of FIGS. 2A to 6 can be applied in connection with passive mixers. Such passive mixers can be implemented in direct conversion receivers, for example.

Referring to FIG. 2A, a schematic diagram of a portion of a receiver including an offset compensation circuit 102A will be described. The receiver of FIG. 2A is configured to detect an offset based on a differential input of the amplifier 116 and to compensate for the offset at the input of the amplifier 116. As illustrated, the receiver is a direction conversion receiver. The offset compensation circuit 102A can apply an offset compensation signal in a signal path to one of the input terminals of the amplifier 116 to compensate for a differential offset. The offset compensation signal can be applied in a feedback loop of the amplifier 116. In the embodiment of FIG. 2A, the offset compensation signal can be applied at an offset compensation node N3 in a signal path and between the mixer 112 and an input of the amplifier 116.

As illustrated, the offset compensation circuit 102A includes a differential amplifier 202, a first current source 204, and a second current source 206. The differential amplifier 202, the first current source 204, and the second current source 206 can be implemented outside of the feedback path that sets the gain of the amplifier 116. The differential amplifier 202 can be an operational amplifier. The differential amplifier 202 can receive the differential output of the mixer 112 at its input terminals and generate an output indicative of the offset of the input offset voltage $V_{OS}$ to the amplifier 116. Since the loop that includes the differential amplifier 202 can be a relatively low frequency loop, relatively large devices can be used. To reduce the impact of the capacitance from such relatively large devices, resistors can be implemented in series between input terminals of the differential amplifier 202 and nodes N1 and N2, respectively. Such resistors can be implemented in connection with any of the other disclosed embodiments. Chopper stabilization, switched capacitor double sampling, or other low offset sampling techniques can alternatively or additionally be implemented. These techniques can be implemented in connection with any of the other disclosed embodiments. The output of the illustrated differential amplifier 202 indicates that the input offset voltage $V_{OS}$ to the amplifier 116 is a negative voltage or a positive voltage. The differential amplifier 202 can dynamically sense the offset voltage.

The output of the differential amplifier 202 can be received by the first current source 204 and the second current source 206. While the first current source 204 and the second current source 206 illustrated in FIG. 2A are configured to apply an offset compensation signal in a signal path to the inverting output terminal of the amplifier 116, these current sources can alternatively apply an offset compensation signal in a signal path to the non-inverting output terminal of the amplifier 116. In other embodiments, the first current source 204 and the second current source 206 can be coupled to different signal paths associated with the differential outputs to the amplifier 116, such as in the embodiment shown in FIG. 4A.

In FIG. 2A, an offset resistor $R_{OS}$ is disposed between the feedback node N2 and the offset compensation node N3. An offset current $I_{OS}$ can be passed through the offset resistor $R_{OS}$ that is in series in a signal path to an input terminal of the amplifier 116 and within a feedback loop of the amplifier 116. This can generate an offset compensation voltage that is approximately equal in magnitude and opposite in polarity to the offset voltage. The magnitude of both current sources 204 and 206 can be approximately equal where one current source sources current from a supply voltage and the second source sinks approximately the same current on the opposite side of the offset resistor $R_{OS}$ to thereby generate the compensation voltage and prevent the offset correction current from disturbing a desired operation of the signal path.

The first current source 204 and the second current source 206 can be DC current sources. The first current source 204 can provide a current that has an opposite polarity than a current that can be provided by the second current source 206. The first current source 204 can generate a current having a first polarity on one side of the offset resistor $R_{OS}$ and the second current source 206 can generate a current having a second polarity, which is opposite the first polarity, on the other side of the offset resistor $R_{OS}$. The current provided by the first current source 204 and/or the second current source 206 can create a voltage drop across the offset resistor $R_{OS}$ to substantially cancel the input offset voltage $V_{OS}$. A resistor with substantially the same resistance as the offset resistor $R_{OS}$ can be included in a signal path to the other input of the amplifier 116 for balance. The offset resistor $R_{OS}$ can be considered part of the offset compensation circuit 102A.

As such, the first current source 204 and the second current source 206 can provide currents of opposite polarity and approximately equal magnitude to reduce the input offset to the amplifier 116. The output of the differential amplifier 202 can also control a magnitude of the offset correction signal provided by the offset compensation circuit such that the differential offset at the input of the amplifier 116 is significantly reduced or substantially eliminated.

FIG. 2B is a schematic diagram of a portion of a receiver supporting analysis of offset compensation for the embodiment of FIG. 2A. While a single ended circuit is analyzed, and the analysis applies to a fully differential circuit. If the amplifier 116 were uncompensated, an offset voltage $V_X$ at node N1 would create leakage current from the local oscillator 114 when the mixer 112 connects to the input. Accordingly, the voltage at node N1 would be approximately 0 Volts when no other signals are present. In FIG. 2B, the first feedback node N1 and the first offset compensation node N3A are the same node.

The amplifier 116 has a finite open loop DC gain A, such that A≠∞. When ignoring the offset compensation resistor $R_{OS}$ and any signals applied by the first current source 204 and/or the second current source 206, the output voltage $V_o$ can be based on DC gain A, offset voltage $V_X$ at node N1, and input offset voltage $V_{OS}$.

The offset voltage $V_X$ at node N2 if the amplifier 116 were uncompensated can be represented by equation 1:

$$V_x = \frac{V_c}{\left(\frac{R_f}{R_{in}} + 1\right)} \quad \text{(Equation 1)}$$

In equation 1, $R_F$ represents the resistance of feedback resistor $R_F$ and $R_{IN}$ represents the resistance between the output of the mixer 112 and the node N2.

If the amplifier 116 were uncompensated, the uncompensated offset voltage $V_X$ at node N2 can be represented by equation 2:

$$V_x = \frac{-A}{\left(\frac{R_f}{R_{in}} + 1 + A\right)} V_{os}. \quad \text{(Equation 2)}$$

Typically, the resistance $R_F$ is greater than or equal to the resistance $R_{IN}$. Therefore, the relationship in equation 3 can apply:

$$\frac{-A}{2+A} V_{os} \leq V_x < V_{os} \quad \text{(Equation 3)}$$

In equation 3, the high value is in the limit as the open loop gain approaches infinity. The $V_X$ node voltage at node N1 can be close to the input offset voltage $V_{OS}$ of the amplifier for practical feedback amplifiers 116.

One method of correcting the input offset voltage $V_{OS}$ is to apply a DC offset correction voltage supplied by a relatively low value resistor and DC current sources at an offset correction node. This method can be implemented using the circuits illustrated in FIGS. 2A and 2B. For an amplifier 116 with a finite open loop DC gain A and offset correction, the output voltage $V_O$ can be represented by equation 4:

$$V_O = -A(V_X - I_{OS}R_{OS} + V_{OS}) \quad \text{(Equation 4)}$$

In equation 4, $I_{OS}$ can represent the offset current provided by the first current source 204 at the first offset compensation node N2 and $R_{OS}$ can represent the resistance of the offset resistor $R_{OS}$.

Accordingly, the compensated offset voltage $V_X$ at node N2 with offset compensation can be represented by equation 5:

$$V_x = \frac{V_o}{\left(1 + \frac{R_f}{R_{in}}\right)} = -I_{os}R_{os} + V_{os} \quad \text{(Equation 5)}$$

As such, the output voltage $V_O$ is approximately 0 Volts and the voltage $V_X$ at node N2 is approximately 0 Volts when the product of the offset current $I_{OS}$ and the resistance of the offset resistor $R_{OS}$ is approximately equal to the input offset voltage $V_{OS}$. The offset compensation circuit 102A can set the offset current $I_{OS}$ such that this cancellation of the input offset voltage $V_{OS}$ occurs. Similar principles can be applied in connection with any of the other offset compensation circuits disclosed herein.

FIG. 3 is a schematic diagram of a portion of a receiver including an offset compensation circuit 102B according to an embodiment. The offset compensation circuit 102B can sense an offset voltage at an output of the amplifier 116 and compensate for the offset at the input of the amplifier 116. The differential amplifier 202 of the offset compensation circuit 102B is configured to receive a differential output of the amplifier 116 as an input and generate an indication of the input offset voltage $V_{OS}$ to the amplifier 116 based on the differential output of the amplifier 116. Otherwise, the offset compensation circuit 102B can be substantially the same as the offset compensation circuit 102A of FIG. 2A. In an embodiment, a non-linear offset compensation loop can be implemented. The non-linear offset compensation loop can include a digital-to-analog converter coupled between the differential amplifier 202 and the current sources 204 and 206. Such a digital-to-analog converter can be updated a frequency that is below a desired signal bandwidth and/or responsive to the receiver being powered up.

Figure 4A:
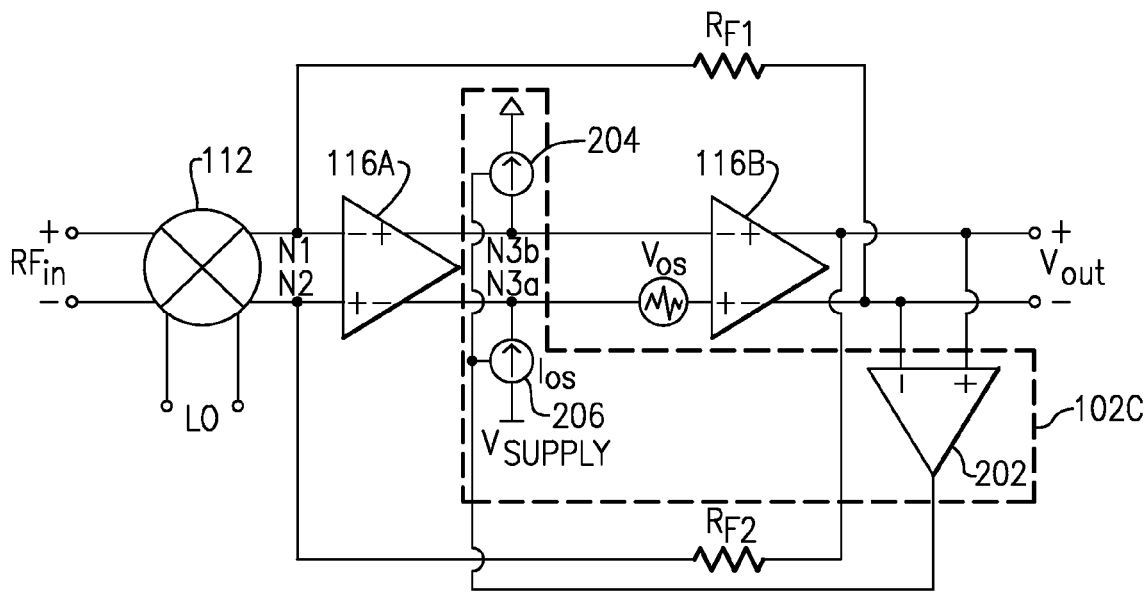
FIG. 4A is a schematic diagram of a portion of a receiver including an offset compensation circuit configured to detect an offset at an output of a multi-stage amplifier and to compensate for the offset between stages of the multi-stage amplifier, according to an embodiment.

FIG. 4A is a schematic diagram of a portion of a receiver including an offset compensation circuit 102C according to an embodiment. The offset compensation described herein can be applied to multi-stage amplifiers. As shown in FIG. 4A, the offset compensation circuit 102C can sense an offset voltage at an output of the amplifier 116 and compensate for the offset between a first stage 116A and a second stage 116B of the amplifier 116. More specifically, in certain embodiments, an offset correction signal can be applied between an output of the first stage 116A and an input of the second stage 116B of the amplifier 116. The first and second current sources 204 and 206, respectively, can be electrically connected to first and second interstage offset compensation nodes N3b and N3a, respectively. In FIG. 4A, current sources 204 and 206 can generate an offset compensation voltage directly at the output of the first stage 116A and the offset compensation voltage can then be applied to the input of the second stage 116B. Internal load resistors of the first stage 116A can function similarly to the offset correction resistor $R_{OS}$ of FIG. 2A and/or FIG. 3. In an embodiment, a non-linear offset compensation loop can be implemented. The non-linear offset compensation loop can include a digital-to-analog converter coupled between the differential amplifier 202 and the current sources 204 and 206. Such a digital-to-analog converter can be updated a frequency that is below a desired signal bandwidth and/or responsive to the receiver being powered up.

As illustrated in FIG. 4A, the first current source 204 and the second current source 206 can apply an offset correction signal to different signal paths of the amplifier 116. The first current source 204 is configured to apply a first offset correction signal in the signal path of the amplifier 116 and between the first feedback node N1 and the inverting output terminal of the second stage 116B of the amplifier 116. In particular, in FIG. 4A, the offset correction can be made at the output of the first stage 116A and applied to the input of the second stage 116B. The resulting offset correction can impact the input node and output nodes of the amplifier 116. The second current source 206 is configured to apply a second offset correction signal in the signal path of the amplifier 116 and between the second feedback node N2 and the non-inverting output terminal of the second stage 116B of the amplifier 116. As such, the offset compensation circuit 102C can compensate for offsets within the feedback loop of the amplifier 116 and also in the signal path of the amplifier 116.

Figure 4B:
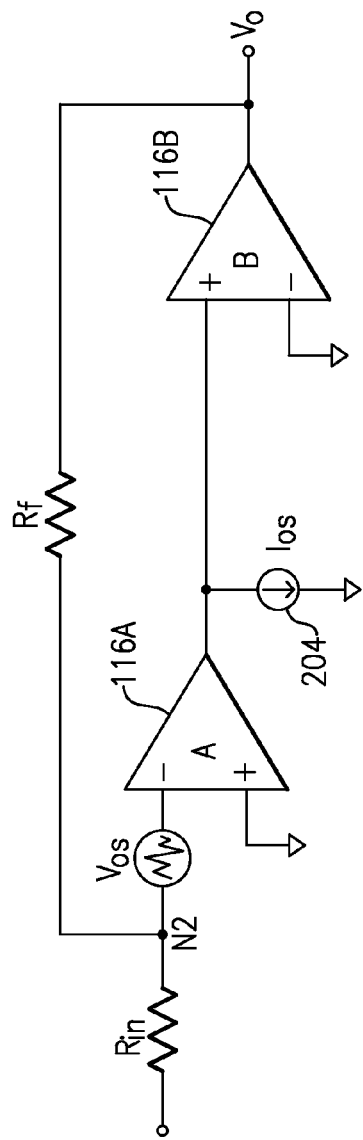
FIG. 4B is a schematic diagram of a portion of a direct conversion receiver supporting analysis of offset correction between stages of the multi-stage amplifier of FIG. 4A.

FIG. 4B is a schematic diagram of a portion of a direct receiver to modeling offset compensation for the embodiment of FIG. 4A. While a single ended circuit is analyzed, the analysis can also apply to a fully differential circuit. If the amplifier 116 were uncompensated, an offset voltage $V_X$ at node N2 would create leakage current from the local oscillator 114 when the mixer 112 connects to the input. Accordingly, the voltage at node N2 would be approximately 0 Volts when no other signals are present. In FIG. 4B, the current source 204 can be arranged to source current or sink current. Accordingly the current source 204 in FIG. 4B can provide a correction current having a positive polarity or a negative polarity.

If the amplifier 116 were uncompensated, the output voltage $V_O$ of the amplifier 116 can be represented by equation 6:

$$V_O = B[-A(V_X + V_{OS}) + I_{OS}R_{OS}], \quad \text{(Equation 6)}$$

In equation 6, A represents the gain of the first stage 116A of the amplifier 116 and B represents the gain of the second stage 116B of the amplifier 116.

The voltage $V_X$ at node N2 can be represented by equation 1 above. Based on equation 1 and equation 6, equation 7 can be derived.

$$V_o\left(\frac{1}{B} + \frac{A}{1 + \frac{R_f}{R_{in}}}\right) = -AV_{os} + I_{os}R_{os} \quad \text{(Equation 7)}$$

As indicated by in equation 7, the output voltage $V_O$ can be approximately 0 Volts when the product of the first stage gain A and the output voltage $V_O$ approximately equals the product of the offset current $I_{OS}$ and the resistance of the offset resistor $R_{OS}$. The offset compensation circuit 102C can set the offset current $I_{OS}$ such that this cancellation of the input offset voltage $V_{OS}$ occurs. Similar principles can be applied in connection with any of the other offset compensation circuits disclosed herein.

Figure 4C:
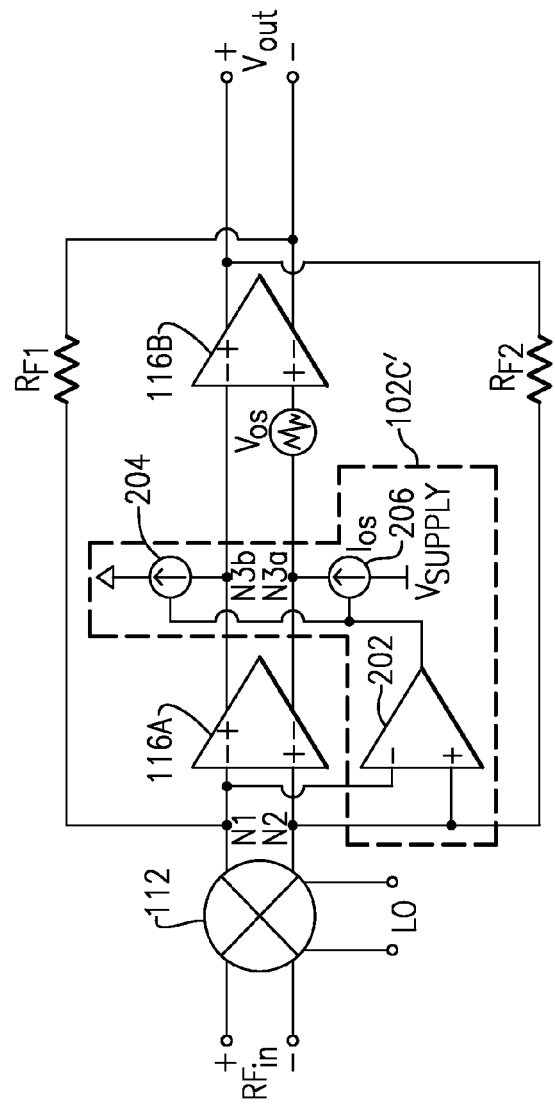
FIG. 4C is a schematic diagram of a portion of a receiver including an offset compensation circuit configured to detect an offset at an input of a multi-stage amplifier and to compensate for the offset between stages of the multi-stage amplifier, according to an embodiment.

FIG. 4C is a schematic diagram of a portion of a receiver including an offset compensation circuit 102C' configured to detect an offset at an input of a multi-stage amplifier and to compensate for the offset between stages of the multi-stage amplifier, according to an embodiment. The offset compensation circuit 102C' of FIG. 4C is similar to the offset compensation circuit 102C of FIG. 4A, except that the differential amplifier 202 in the offset compensation circuit 102C' is arranged differently than the differential amplifier 202 of the offset compensation circuit 102 of FIG. 4A. In FIG. 4C, the offset compensation circuit 102C' includes a differential amplifier 202 configured to sense a differential offset voltage on the input of the amplifier 116. As shown in FIG. 4C, the differential amplifier 202 can have an inverting input terminal electrically connected to a first feedback node N1 and a non-inverting input terminal electrically connected to a second feedback node N2.

Figure 5:
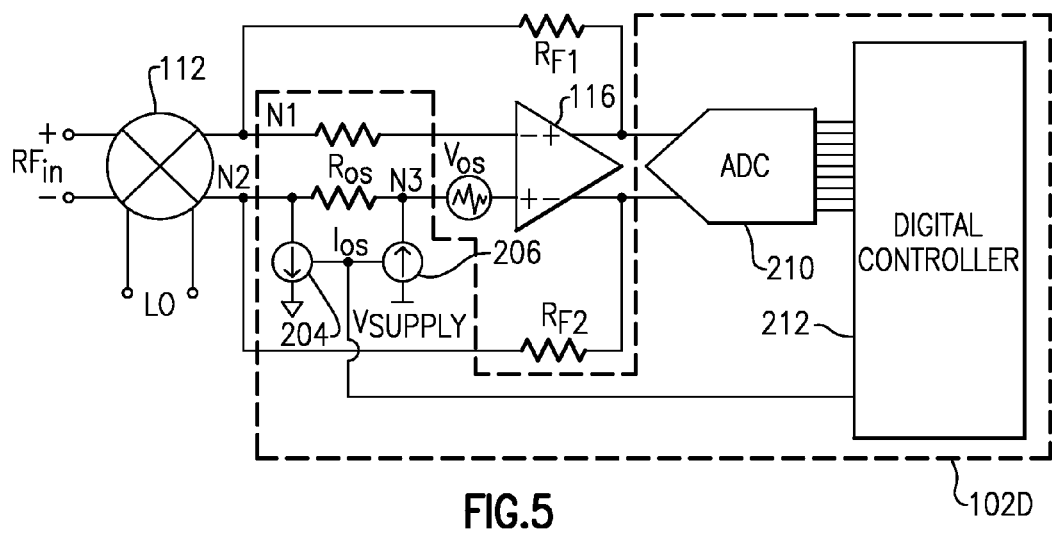
FIG. 5 is a schematic diagram of a portion of a receiver with an offset compensation circuit that includes analog-to-digital converter to detect an offset and a digital controller to control offset compensation, according to an embodiment.

FIG. 5 is a schematic diagram of a portion of a receiver including an offset compensation circuit 102D according to an embodiment. The offset compensation circuit 102D includes an analog-to-digital converter (ADC) 210, a digital controller 212, the first current source 204, and the second current source 206. The ADC 210 is configured to sense a differential offset voltage on the output of the amplifier 116. The digital controller 212 can receive an output of the ADC 210 and provide the first current source 204 and/or the second current source 206 with a control signal to apply offset corrections to reduce or eliminate an input offset voltage $V_{OS}$ of the amplifier 116.

The offset compensation circuit 102D can apply static offset compensation. Accordingly, continuous monitoring of the offset voltage on the output voltage of the amplifier 116 may not be needed. This can reduce power consumption during operation compared to continuous offset monitoring. In one embodiment, the offset compensation circuit 102D can sense an offset with the ADC 210 and adjust an output of the digital controller 212 as part of a startup calibration process. Then during operation of the receiver, the output of the digital controller 212 can remain substantially constant.

Figure 6:
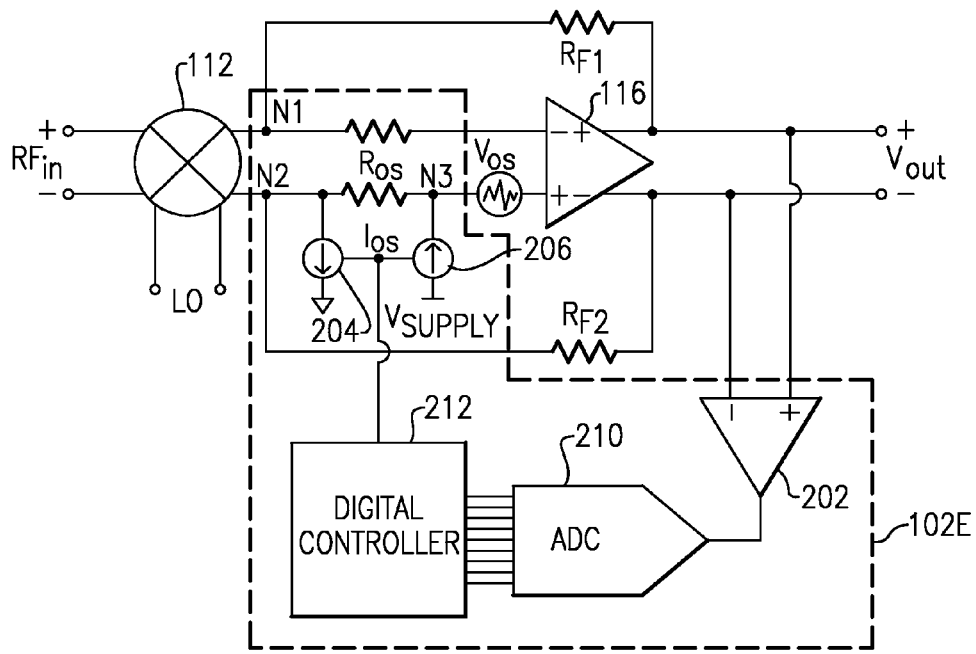
FIG. 6 is a schematic diagram of a portion of a receiver with an offset compensation circuit that includes a differential amplifier, an analog-to-digital and a digital controller, according to an embodiment.

FIG. 6 is a schematic diagram of a portion of a receiver including an offset compensation circuit 102E according to an embodiment. The offset compensation circuit 102E includes a differential amplifier 202 configured to sense a differential offset voltage on the output of the amplifier 116. The output of the differential amplifier 202 can be provided to the ADC 210. Otherwise, the offset compensation circuit 102E can be substantially the same as the offset compensation circuit 102D of FIG. 5.

The systems, apparatus, and methods related to offset compensation are described above with reference to certain embodiments. A skilled artisan will, however, appreciate that the principles and advantages of the embodiments can be used for any other systems, apparatus, or methods with a need for offset compensation.

Such systems, apparatus, and/or methods can be implemented in various electronic devices. Examples of the electronic devices can include, but are not limited to, consumer electronic products, parts of the consumer electronic products, electronic test equipment, wireless communications infrastructure such as base stations, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the systems described above. The elements and acts of the various embodiments described above can be combined to provide further embodiments. The act of any method discussed herein can be performed in any order as appropriate. Moreover, the acts of any method discussed herein can be performed serially or in parallel, as appropriate.

While certain embodiments of the inventions have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An apparatus comprising a receiver with offset compensation, the receiver comprising:
    a mixer configured to downconvert an input signal and generate a differential signal;
    an amplifier configured to amplify the differential signal;
    a feedback path between an output terminal of the amplifier and an input terminal of the amplifier, the feedback path comprising a feedback element electrically connected to a feedback node disposed between the mixer and the input terminal of the amplifier; and
    an offset compensation circuit configured to:
        generate an indication of an offset in the differential signal; and
        apply, based at least partly on the indication of the offset in the differential signal, an offset compensation signal at an offset compensation node configured to receive a signal based on at least a combination of an output signal provided by the mixer and a feedback signal provided by the feedback path, wherein the offset compensation node is in a signal path between the feedback node and the output terminal of the amplifier, and wherein the offset compensation circuit is separate from the feedback path.

2. The apparatus claim 1, wherein the mixer is a passive mixer.

3. The apparatus of claim 1, wherein the amplifier is a transimpedance amplifier.

4. The apparatus of claim 1, wherein the amplifier comprises a first stage and a second stage, and wherein the offset compensation node is disposed between the first stage and the second stage.

5. The apparatus of claim 1, wherein the feedback element comprises a resistive circuit element, and wherein at least a portion of the offset compensation circuit is disposed in series between the resistive circuit element and the input terminal of the amplifier.

6. The apparatus of claim 1, wherein the receiver is a direct conversion receiver, and wherein the differential signal generated by the mixer is a baseband signal.

7. The apparatus of claim 1, wherein the mixer is coupled to a local oscillator, and wherein the offset compensation signal is configured to cause an amount of leakage from the local oscillator at one or more input ports of the mixer to be reduced, the one or more input ports of the mixer being configured to receive the input signal.

8. The apparatus of claim 1, wherein the receiver comprises an antenna port, wherein the mixer is coupled to a local oscillator, and wherein the offset compensation signal is configured to cause an amount of leakage from the local oscillator at the antenna port to be reduced.

9. The apparatus of claim 1, wherein the offset compensation circuit is configured to receive the differential signal and to generate the indication of the offset in the differential signal based at least partly on the differential signal.

10. The apparatus of claim 1, wherein the offset compensation circuit comprises a differential amplifier configured to receive the differential signal and to generate the indication of the offset in the differential signal.

11. The apparatus of claim 1, wherein the amplifier is configured to generate a differential output, wherein the offset compensation circuit is configured to generate the indication of the offset in the differential signal based at least partly on the differential output of the amplifier.

12. The apparatus of claim 1, wherein the offset compensation circuit comprises a first current source configured to apply, based at least partly on the indication of the offset in the differential signal, the offset compensation signal at the offset compensation node.

13. The apparatus of claim 12, wherein the offset compensation circuit further comprises a second current source configured to apply, based at least partly on the indication of the offset in the differential signal, an other offset compensation signal in the signal path between the mixer and the output terminal of the amplifier, the other offset compensation signal having an opposite polarity as the offset compensation signal.

14. An apparatus with offset compensation, the apparatus comprising:
a local oscillator configured to generate a local oscillator output;
a mixer coupled to the local oscillator, the mixer configured to downconvert a radio frequency signal based at least partly on the local oscillator output;
an amplifier configured to receive an output from the mixer at an input terminal of the amplifier;
a feedback path comprising a feedback element coupled between an output terminal of the amplifier and the input terminal of the amplifier, wherein the feedback element is electrically connected to a feedback node disposed between the mixer and the input terminal of the amplifier; and
an offset compensation circuit configured to:
generate an indication of an offset present at the input terminal of the amplifier; and
apply, based at least partly on the indication of the offset, an offset compensation signal at an offset compensation node configured to receive a signal based on at least a combination of an output signal provided by the mixer and a feedback signal provided by the feedback path, wherein the offset compensation node is in a signal path between the feedback node and the output terminal of the amplifier, and wherein the feedback path is separate from the offset compensation circuit;
wherein the offset compensation signal is configured to cause leakage current from the local oscillator at an input port of the mixer to be reduced.

15. The apparatus of claim 14, further comprising:
an antenna port; and
a low-noise amplifier configured to amplify a signal received at the antenna port and to provide the radio frequency signal to the mixer via a balun.

16. The apparatus of claim 14, wherein the amplifier comprises two stages, and wherein the offset compensation node is disposed between the two stages.

17. The apparatus of claim 14, wherein the mixer is a passive mixer.

18. An electronically implemented method of compensating for an offset in a receiver, the method comprising:
providing, by a passive mixer of a receiver, a differential signal to input terminals of a transimpedance amplifier, wherein the transimpedance amplifier comprises an amplifying circuit and a feedback path between one of the input terminals and an output terminal of the transimpedance amplifier, wherein the feedback path comprises a feedback element electrically coupled to a feedback node disposed between the passive mixer and the one of the input terminals;
detecting an offset in the differential signal received by the transimpedance amplifier; and
applying an offset compensation signal to a combined signal at an offset correction node to compensate for the detected offset, wherein the combined signal is a combination of at least an output signal from the passive mixer and a feedback signal from the feedback path, and wherein the offset correction node is in a signal path between the feedback node and an output of the transimpedance amplifier.

19. The method of claim 18, wherein applying causes an amount of leakage at one or more input ports of the passive mixer from a local oscillator coupled to the passive mixer to be reduced.

20. The method of claim 18, wherein detecting is performed by an offset compensation circuit that includes a differential amplifier configured to receive the differential signal and to generate an indication of the offset in the differential signal.

\* \* \* \* \*